United States Patent
Tsai et al.

(10) Patent No.: US 7,042,373 B2
(45) Date of Patent: May 9, 2006

(54) ERROR MEASURING METHOD FOR DIGITALLY SELF-CALIBRATING PIPELINE ADC AND APPARATUS THEREOF

(75) Inventors: Jui-Yuan Tsai, Tai-Nan (TW); Wen-Chi Wang, Yun-Lin Hsien (TW); Chia-Liang Chiang, Taipei Hsien (TW); Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 10/907,652

(22) Filed: Apr. 11, 2005

(65) Prior Publication Data

US 2005/0225461 A1 Oct. 13, 2005

(30) Foreign Application Priority Data

Apr. 12, 2004 (TW) .............................. 93110096 A (51) Int. Cl.
*H03M 1/10* (2006.01)

(52) U.S. Cl. ................ 341/120; 341/118; 341/161; 341/162; 341/172

(58) Field of Classification Search ............. 341/118, 341/120, 150, 155, 161–162, 172
See application file for complete search history.

(56) References Cited

U.S. PATENT DOCUMENTS

| | | | | |
|---|---|---|---|---|
| 5,465,092 A | * | 11/1995 | Mayes et al. ............... | 341/118 |
| 5,499,027 A | | 3/1996 | Karanicolas et al. | |
| 5,510,789 A | * | 4/1996 | Lee ............................ | 341/120 |
| 5,668,549 A | * | 9/1997 | Opris et al. ................ | 341/118 |
| 5,929,796 A | * | 7/1999 | Opris et al. ................ | 341/120 |
| 6,222,471 B1 | * | 4/2001 | Nagaraj ...................... | 341/120 |
| 6,369,744 B1 | | 4/2002 | Chuang | |
| 6,563,445 B1 | * | 5/2003 | Sabouri ...................... | 341/120 |
| 6,606,042 B1 | * | 8/2003 | Sonkusale et al. .......... | 341/120 |
| 6,642,871 B1 | * | 11/2003 | Takeyabu et al. ........... | 341/120 |

* cited by examiner

*Primary Examiner*—Rexford Barnie
*Assistant Examiner*—Khai Nguyen
(74) *Attorney, Agent, or Firm*—Winston Hsu (57) ABSTRACT

A pipeline ADC includes a pipeline structure having a plurality of analog-to-digital converting units cascaded in series; and a correcting unit coupled to the pipeline structure for correcting an output value of the pipeline structure according to a set of calibration constants. One of the analog-to-digital converting units contains a capacitor switching circuit. During error measurement of the pipeline ADC, the capacitor switching circuit switches to change capacitance allocation of the analog-to-digital converting unit so as to obtain the set of calibration constants.

10 Claims, 6 Drawing Sheets

ERROR MEASURING METHOD FOR DIGITALLY SELF-CALIBRATING PIPELINE ADC AND APPARATUS THEREOF

BACKGROUND OF INVENTION

1. Field of the Invention

The present invention relates to analog-to-digital converters (ADCs), and more particularly, to an error measuring method for a digitally self-calibrating pipeline ADC and an apparatus thereof.

2. Description of the Prior Art

A pipeline analog-to-digital converter (ADC) is a typical choice for high speed and high resolution analog-to-digital conversion. Without using any trimming techniques or calibration techniques such as analogue calibration or digital calibration, the resolution of the pipeline ADC approaches only up to a degree of ten to twelve bits. This resolution limit is mainly due to reasons such as capacitance mismatch induced during manufacturing or a limited gain value of operational amplifiers in the ADC. Additional circuitries or calibration techniques are required for implementing a pipeline ADC having a higher resolution of more bits.

Please refer to U.S. Pat. No. 5,499,027 and U.S. Pat. No. 6,369,744. In the two patents mentioned above, pipeline ADCs including digitally self-calibrating functionality and related circuits thereof are disclosed. According to the above-mentioned patents, an ADC includes a pipeline structure. The pipeline structure includes a plurality of stages of analog-to-digital conversion units including an input stage and a plurality of subsequent stages. In order to calibrate a specific stage of the analog-to-digital conversion units to eliminate errors due to the limitations mentioned above, the ADC further includes a calibration unit corresponding to the specific stage of the analog-to-digital conversion units. The ADC utilizes conversion units of later stages of the analog-to-digital conversion units, the calibration unit, and a set of calibration parameters corresponding to the specific stage of the analog-to-digital conversion units to calibrate such specific stage of the analog-to-digital conversion units.

In a calibration setup mode, the set of calibration parameters are derived from setting input signals of the specific stage of the analog-to-digital conversion units to predetermined values, recording output values of the later stages, and performing proper calculations. Through this design, the set of calibration parameters are measured under the same conditions as that of a run mode, so as to precisely represent errors inherent in the circuitry of the ADC.

SUMMARY OF INVENTION

It is an objective of the present invention to provide an error measuring method for a digitally self-calibrating pipeline ADC and an apparatus thereof.

According to an embodiment, the present invention provides an error measuring method for a pipeline ADC. The pipeline ADC includes a plurality of analog-to-digital converting units cascaded in series to form a pipeline structure. The error measuring method includes: providing an input end of one of the analog-to-digital converting units with a plurality of predetermined biasing voltage combinations; in accordance with each predetermined biasing voltage combination, switching to change capacitance allocation of said analog-to-digital converting unit to perform measurement by measuring an output value of the pipeline structure to generate a first measurement value when the analog-to-digital converting unit is at a first capacitance allocation, and measuring an output value of the pipeline structure to generate a second measurement value when the analog-to-digital converting unit is at a second capacitance allocation; and calculating a calibration constant according to the first and second measurement values, the calibration constant corresponding to an error of the analog-to-digital converting unit.

According to an embodiment, the present invention further provides a pipeline ADC including: a pipeline structure including a plurality of analog-to-digital converting units cascaded in series, one of the analog-to-digital converting units including a switching circuit; and a correcting unit coupled to the pipeline structure for correcting an output value of the pipeline structure according to a set of calibration constants; wherein during error measurement of the pipeline ADC, the switching circuit switches to change capacitance allocation of the analog-to-digital converting unit to obtain the set of calibration constants.

According to an embodiment, the present invention further provides an error measurement circuit for use with a pipeline ADC. The error measurement circuit includes: a first capacitor; a second capacitor; an output stage coupled to the first and second capacitors and a pipeline structure comprising a plurality of converting units of the pipeline ADC, the output stage including an output end; and a switch combination coupled to the first and second capacitors for switching to change capacitance allocation of the first and second capacitors located among a plurality of fixed biasing voltages and the output stage according to a plurality of control signals to generate a plurality of measurement values at the output end.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
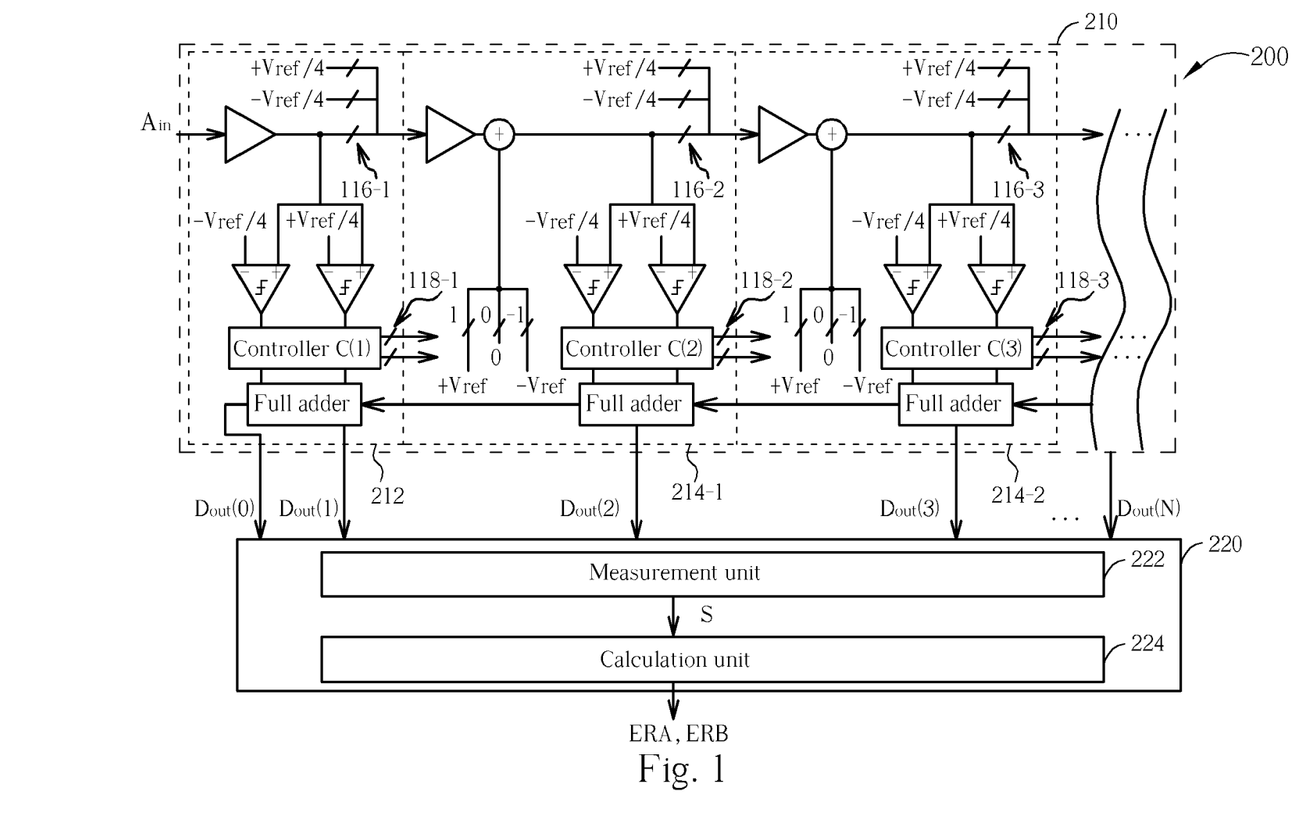
FIG. 1 is a diagram of a digitally self-calibrating pipeline ADC according to an exemplary embodiment of the present invention.

Please refer to FIG. 1 showing a diagram of a digitally self-calibrating pipeline analog-to-digital converter (ADC) 200 according to an exemplary embodiment of the present invention. The pipeline ADC 200 includes a pipeline structure 210 that is, in some occasions, simply referred to as a pipeline 210 hereinafter. The pipeline structure 210 includes an input stage 212 and a plurality of subsequent stages 214-1, 214-2, . . . , and 214-N cascaded in series as shown in FIG. 1. The pipeline ADC 200 further includes a calibration unit 220 including a measurement unit 222 and a calculation unit 224. In the following description of this embodiment, the pipeline ADC 200 is illustrated using a structure of 1.5 bits/stage, whereof circuit configurations and operation principles are well known in the art and are therefore not explained herein. Please note that those skilled in the art will also understand that in addition to the 1.5 bit/stage structure, the inventive method and apparatus can also be applied to a 1 bit/stage or multi-bit/stage architecture in different embodiments of the present invention.

Operations of the digitally self-calibrating pipeline ADC 200 involve both a calibration setup mode and a run mode. In the calibration setup mode, the pipeline ADC 200 connects an input end of each subsequent stage 214-I (I=1, ..., N) to a fixed input value respectively and calculates a calibration constant corresponding to each subsequent stage 214-I according to digital output values Dout(1), ..., Dout(N) of the pipeline structure 210. In the run mode, the pipeline ADC 200 utilizes a calibration unit (not shown) to calibrate digital output values Dout(1), ..., Dout(N) outputted by the pipeline structure 210 according to the calibration constants derived in the calibration setup mode, so as to decrease or eliminate erroneous influences due to different kinds of factors in the pipeline ADC 200.

Figure 2:
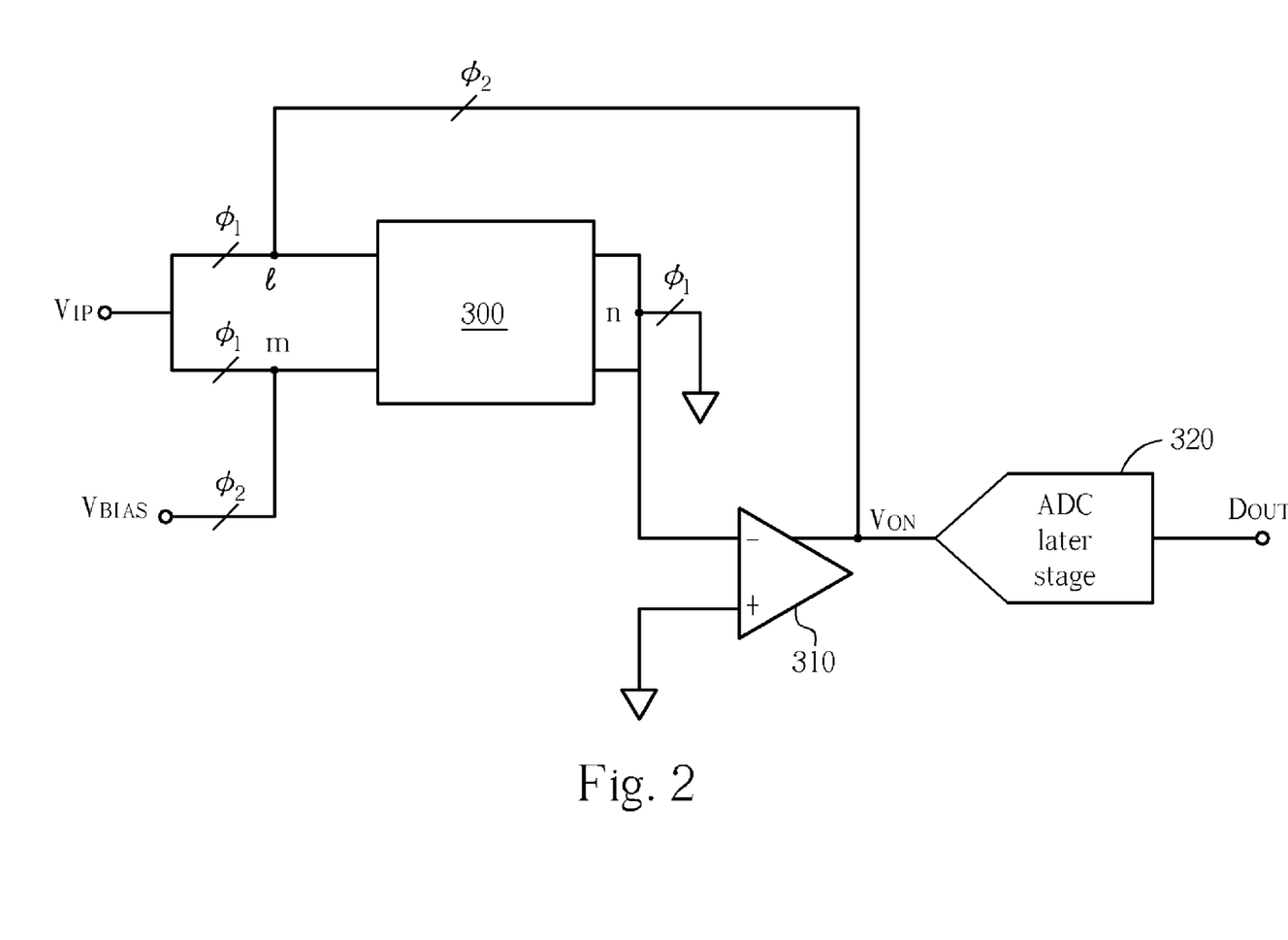
FIG. 2 is a diagram of a measurement circuit according to an exemplary embodiment of the present invention.

In the pipeline structure mentioned above, each subsequent stage 214-I (where I=1, ..., N) includes an analog input end and a digital input end coupled to an output signal of a previous stage through switches 116-I and 118-I, respectively. According to this embodiment of the present invention, each of the subsequent stages 214-I includes a configuration as shown in FIG. 2. Please note, for simplicity, FIG. 2 illustrates a single-ended mode of the configuration. Those skilled in the art will recognize that in addition to the single end mode, a differential mode of the configuration can also be applied to the present invention. In FIG. 2, each of the subsequent stages 214-I includes a capacitor switching circuit 300 coupled through a plurality of switches controlled by control signals $\phi_1$ and $\phi_2$ to a signal $V_{IP}$ at the analog input thereof, a biasing signal $V_{BIAS}$, an operational amplifier 310, and a subsequent stage 320 that is a later stage in the pipeline structure 210. As a result of the configuration shown in FIG. 2, in the calibration setup mode, a value Dout is derived from the output end of the later stage 320 of the subsequent stages 214-I with proper fixed values inputted into the input ends of the subsequent stages 214-I to calculate the calibration constant corresponding to each of the subsequent stages 214-I. As will be understood by those skilled in the art, in the calibration setup mode, the switches controlled by the control signal $\phi_1$ and the switches controlled by the control signal $\phi_2$ are activated alternatively.

In this embodiment, in the subsequent stages 214-I, the capacitor switching circuit 300 includes a first capacitor $C_H$ and a second capacitor $C_S$ used as a hold capacitor and a sample capacitor, respectively. The capacitor switching circuit 300 is at either a first allocation or a second allocation at one time. In the first allocation, denoted with a parameter C having a value C=0 in the following, the first capacitor $C_H$ is connected between the node I and the node n and the second capacitor $C_S$ is connected between the node m and the node n. In the second allocation, denoted with the parameter C having a value C=1 in the following, the first capacitor $C_H$ is connected between the node m and the node n and the second capacitor $C_S$ is connected between the node I and the node n.

Figure 3:
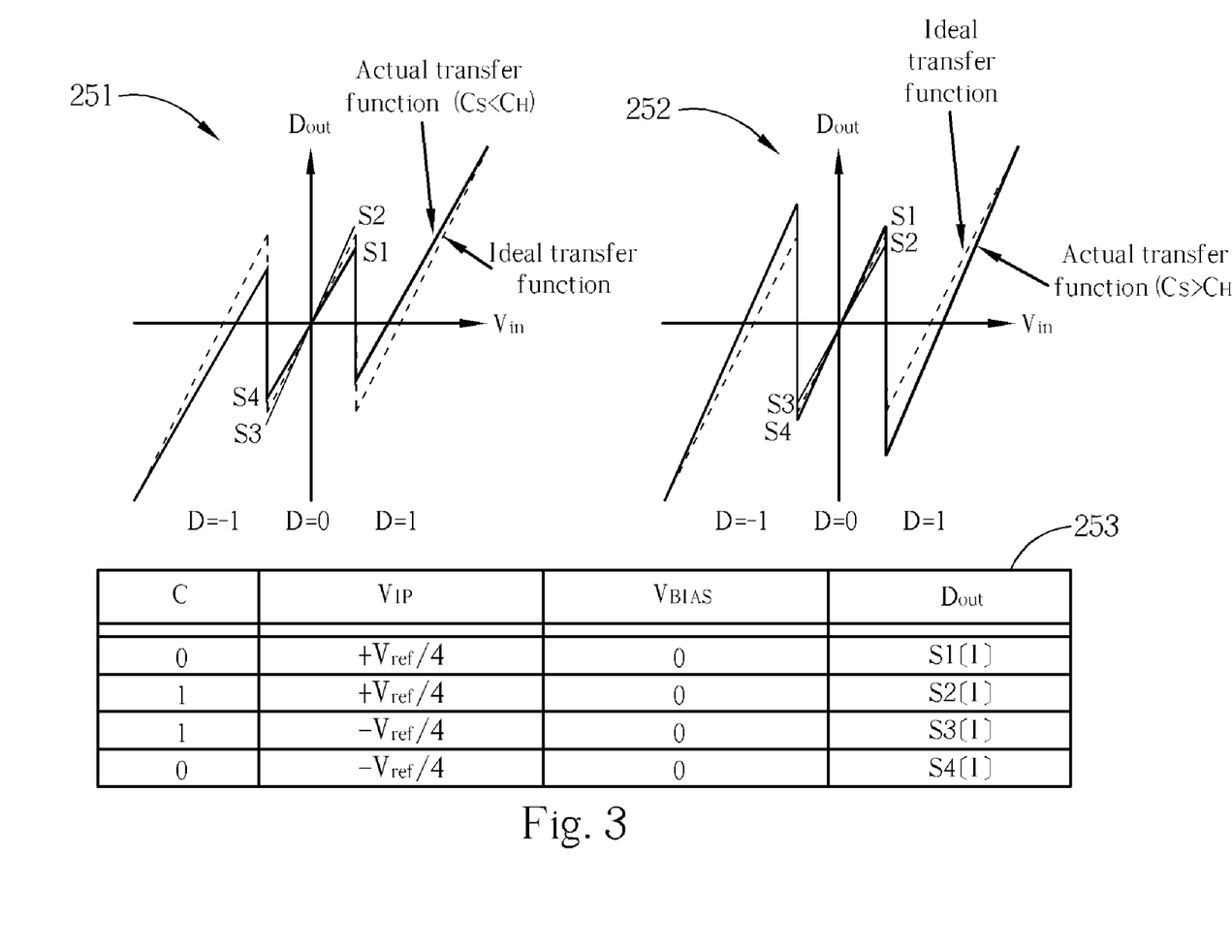
FIG. 3 is a first example of measurement conditions of the measurement circuit shown in FIG. 2.

When measuring the calibration constant in the calibration setup mode, the pipeline ADC 200 inputs signals of fixed values through the switches 116-I and 118-I, respectively. The inputs signals of fixed values are thereby coupled to the corresponding subsequent stage 214-I, so as to calculate the calibration constant corresponding to each of the subsequent stages 214-I. Please refer to FIG. 3 showing a first example of measurement conditions while performing calibration constant measurement using the configuration of FIG. 2. As shown by the condition table 253 in FIG. 3, as the capacitor allocation parameter C, the input end signal $V_{IP}$, and the biasing signal $V_{BIAS}$ vary, the measurement unit 222 measures the output value Dout at the digital output ends of the pipeline structure 210 to derive the values S1(I), S2(I), S3(I), and S4(I), respectively. Additionally, the calculation unit 224 calculates calibration constants ERA(I) and ERB(I), which are used for calibrating analog-to-digital conversion outputs in the run mode according to the following equations:

$$ERA(I)=2[S1(I)-S2(I)]; \text{ and}$$

$$ERB(I)=2[S3(I)-S4(I)].$$

The transfer functions 251 and 252 shown in FIG. 3 illustrate the physical representation of the values mentioned above. In FIG. 3, the transfer functions 251 and 252 respectively represent two possible error situations, whose significances are well known in the art.

Figure 4:
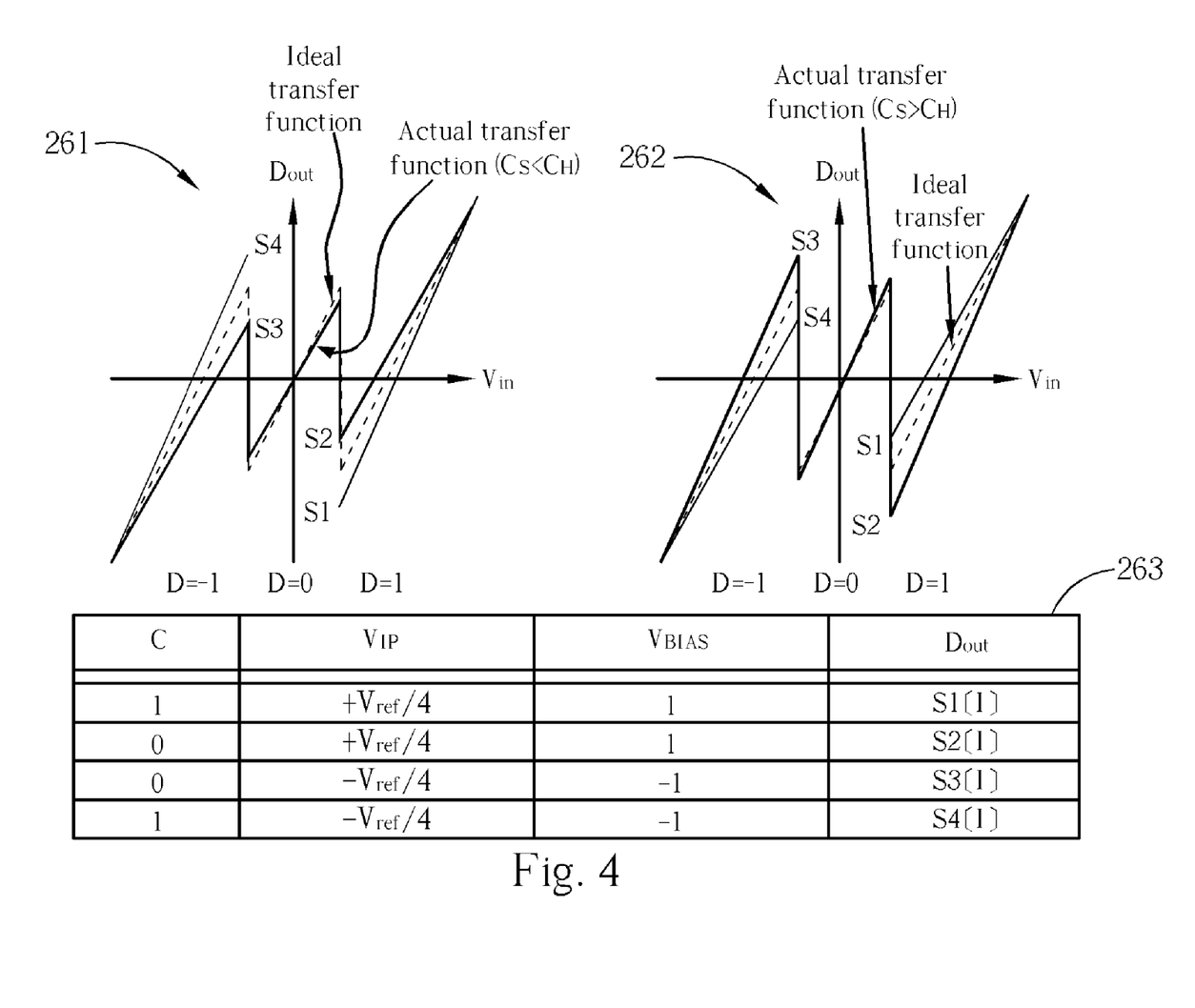
FIG. 4 is a second example of measurement conditions of the measurement circuit shown in FIG. 2.

Please refer to FIG. 4 illustrating a second example of the measurement conditions while generating the calibration constants using the configuration shown in FIG. 2. As shown by the condition table 263 in FIG. 4, as the capacitor allocation parameter C, the input end signal $V_{IP}$, and the biasing signal $V_{BIAS}$ vary, the measurement unit 222 measures the output value Dout at the digital output ends of the pipeline structure 210 to derive the values S1(I), S2(I), S3(I), and S4(I), respectively. Additionally, the calculation unit 224 calculates calibration constants ERA(I) and ERB(I), which are used for calibrating analog-to-digital conversion outputs in the run mode according to the following equations:

$$ERA(I)=(2/3)[S1(I)-S2(I)]; \text{ and}$$

$$ERB(I)=(2/3)[S3(I)-S4(I)].$$

The transfer functions 261 and 262 shown in FIG. 4 illustrate the physical representation of the values mentioned above. In FIG. 4, the transfer functions 261 and 262 respectively represent two possible error situations, whose significances are well known in the art.

Figure 5:
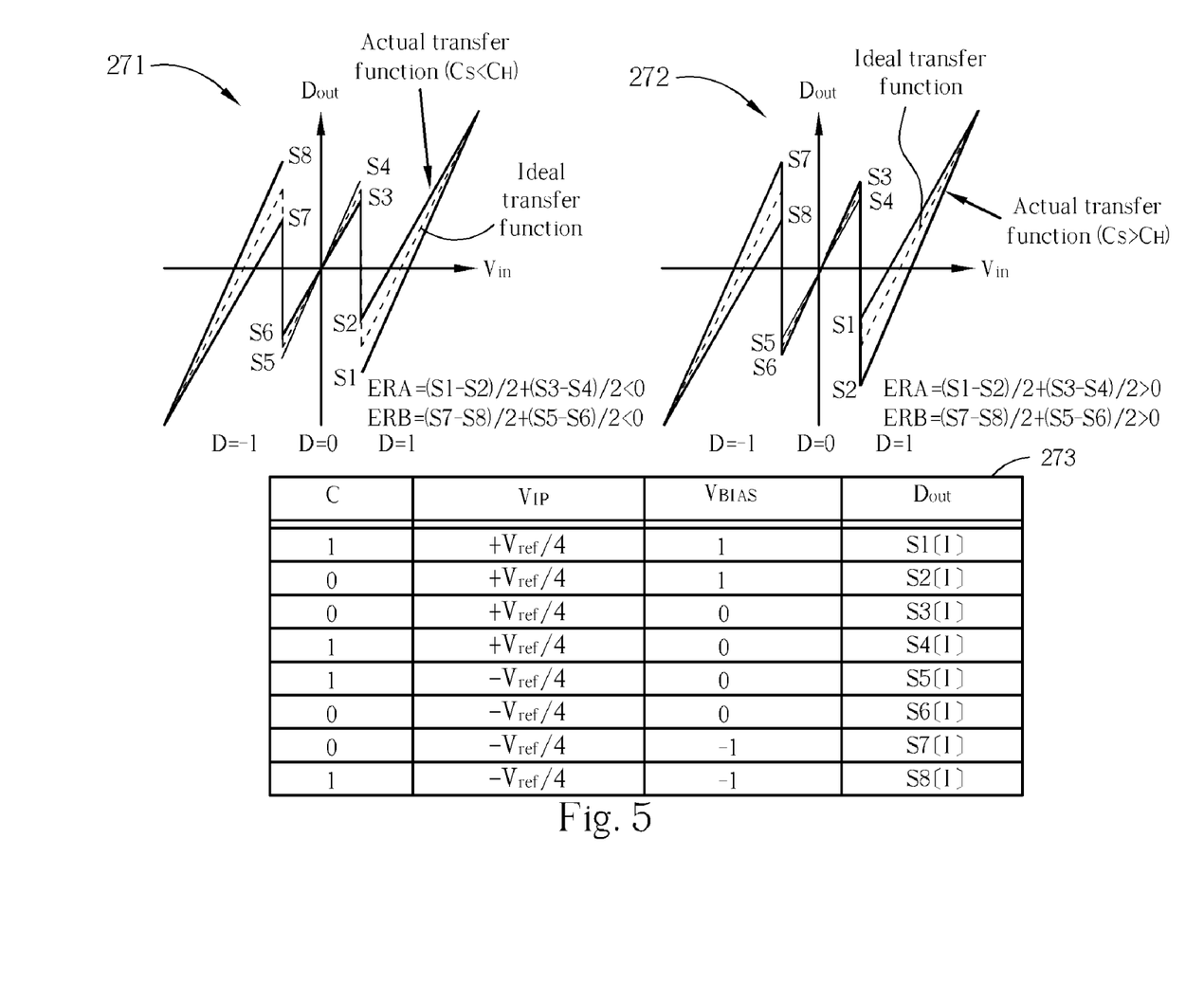
FIG. 5 is a third example of measurement conditions of the measurement circuit shown in FIG. 2.

Please refer to FIG. 5 illustrating a third example of the measurement conditions while generating the calibration constants using the configuration shown in FIG. 2. As shown by the condition table 273 in FIG. 5, as the capacitor allocation parameter C, the input end signal $V_{IP}$, and the biasing signal $V_{BIAS}$ vary, the measurement unit 222 measures the output value Dout at the digital output ends of the pipeline structure 210 to derive the values S1(I), S2(I), S3(I), S4(I), S5(I), S6(I), S7(I), and S8(I), respectively. Additionally, the calculation unit 224 calculates calibration constants ERA(I) and ERB(I), which are used for calibrating analog-to-digital conversion outputs in the run mode according to the following equations:

$$ERA(I)=\{[S1(I)-S2(I)]+[S3(I)-S4(I)]\}/2; \text{ and}$$

$$ERB(I)=\{[S7(I)-S8(I)]+[S5(I)-S6(I)]\}/2.$$

The transfer functions 271 and 272 shown in FIG. 5 illustrate the physical representation of the values mentioned above. In FIG. 5, the transfer functions 271 and 272 respectively represent two possible error situations, whose significances are well known in the art.

The three measurement conditions and calculations thereof mentioned above are only a few examples of measurement and calculation methods using the measurement circuit configuration disclosed according to this embodiment of the present invention. The present invention is not meant to be limited to only the exemplary embodiments described above. Other measurement conditions and calculation methods thereof can be realized in accordance with the principles and the spirit of the present invention and are also embodiments of the present invention.

Figure 6:
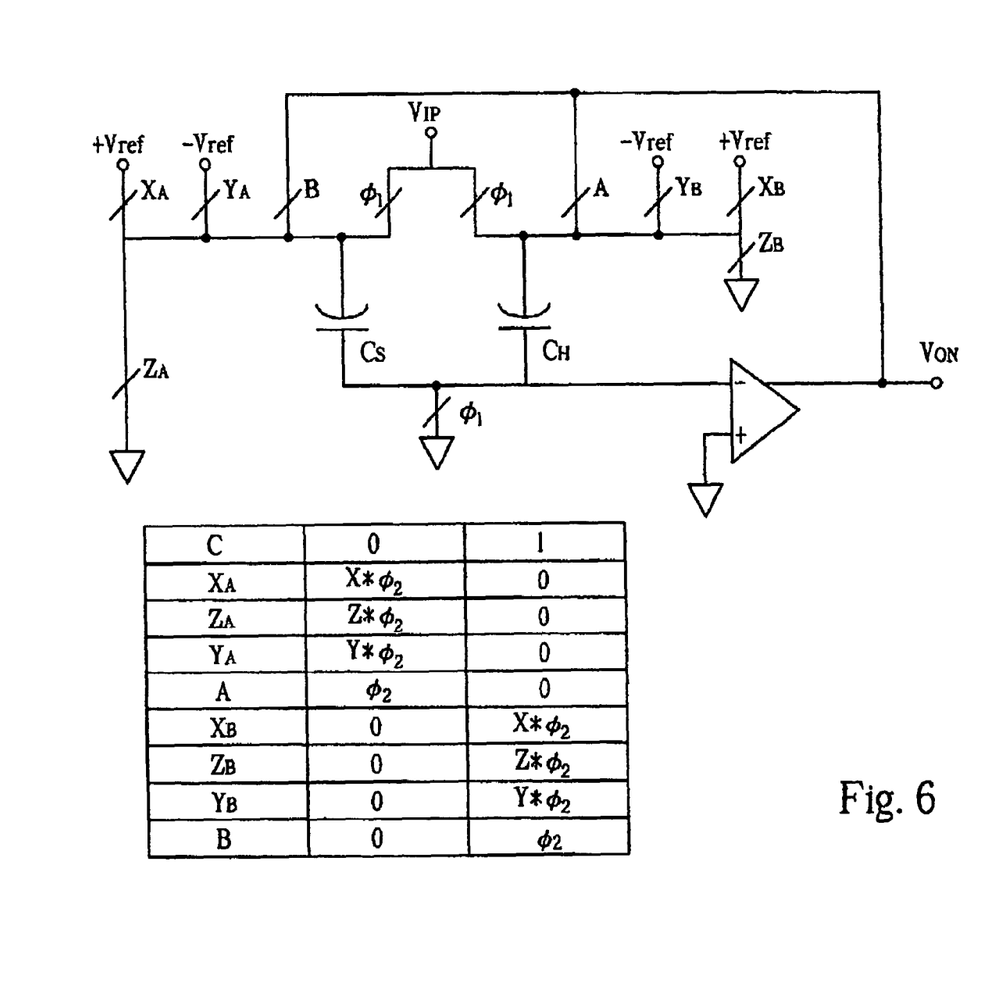
FIG. 6 is a circuit diagram of the measurement circuit shown in FIG. 2.

Please refer to FIG. 6 illustrating a circuit diagram of the measurement circuit shown in FIG. 2 according to a possible implementation. In FIG. 6, in order to realize the operation of the capacitor switching circuit 300 mentioned above, an end of the first capacitor $C_H$ is connected to a plurality of switches controlled by control signals A, $X_B$, $Y_B$, and $Z_B$, respectively, so as to respectively couple the first capacitor $C_H$ to the output end $V_{ON}$ of the operational amplifier 310, and the fixed biasing voltages +Vref, −Vref, and 0V. Additionally, an end of the second capacitor $C_S$ is connected to a plurality of switches controlled by control signals B, $X_A$, $Y_A$, and $Z_A$, respectively, so as to respectively couple the second capacitor $C_S$ to the output end $V_{ON}$ of the operational amplifier 310, and the fixed biasing voltages +Vref, −Vref, and 0V. According to the configuration of this implementation of the measurement circuit, the operational conditions of the switches mentioned above being at either the first allocation (C=0) or the second allocation (C=1) are illustrated by the condition table shown in FIG. 6. Please note that only one of the logic values X, Y, and Z in the condition table is at a value of 1 while the others are zero, so as to input one of the fixed values +Vref, −Vref, and 0V into the subsequent stage as is needed for the above-mentioned operations.

The implementation of the measurement circuit shown in FIG. 6 is only one of various kinds of implementation choices of the configuration shown in FIG. 2. Those skilled in the art will recognize that other circuit configurations can be realized in accordance with the principles and the spirit of the present invention mentioned above.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error measuring method for a pipeline ADC, the pipeline ADC including a plurality of analog-to-digital converting units cascaded in series to form a pipeline structure, the error measuring method comprising the following steps:
   providing to the input of one of the analog-to-digital converting units a plurality of predetermined biasing voltage combinations;
   in accordance with each predetermined biasing voltage combination, switching to change capacitance allocation of said analog-to-digital converting unit to perform measurement by measuring an output value of the pipeline structure to generate a first measurement value when the analog-to-digital converting unit is at a first capacitance allocation, and measuring an output value of the pipeline structure to generate a second measurement value when the analog-to-digital converting unit is at a second capacitance allocation, wherein at the first capacitance allocation a first capacitor is electrically connected to a first node and a second capacitor is electrically connected to a second node, and at the second capacitance allocation the first capacitor is electrically connected to the second node and the second capacitor is electrically connected to the first node; and
   calculating a calibration constant according to the first and second measurement values, the calibration constant corresponding to art error of the analog-to-digital converting unit.

2. The error measuring method of claim 1, wherein the calibration constant is a linear combination of the first and second measurement values.

3. The error measuring method of claim 1, wherein the providing step further comprises:
   providing to an analog input end of the analog-to-digital converting unit a reference voltage; and
   providing to a digital input end of the analog-to-digital converting unit a reference signal.

4. A pipeline ADC comprising:
   a pipeline structure comprising a plurality of analog-to-digital converting units cascaded in series, one of the analog-to-digital converting units comprising a switching circuit, the switching circuit comprising a first capacitor, a second capacitor, and a plurality of switches; and
   a correcting unit coupled to the pipeline structure for correcting an output value of the pipeline structure according to a set of calibration constants;
   wherein during error measurement of the pipeline ADC, the switching circuit switches to change capacitance allocation of the analog-to-digital converting unit to obtain the set of calibration constants, wherein at a first capacitance allocation the first capacitor is, electrically connected to a first node and the second capacitor is electrically connected to a second node, and at a second capacitance allocation the first capacitor is electrically connected to the second node and the second capacitor is electrically connected to the first node.

5. The pipeline ADC of claim 4 further comprising:
   a measurement unit coupled to the pipeline structure for measuring a plurality of measurement values; and
   a calculation unit coupled to the measurement unit for calculating the set of calibration constants according to the measurement values.

6. The pipeline ADC of claim 5, wherein the measurement unit measures an output value of the pipeline structure to generate a first measurement value when the analog-to-digital converting unit is at the first capacitance allocation, and the measurement unit measures an output value of the pipeline structure to generate a second measurement value when the analog-to-digital converting unit is at the second capacitance allocation.

7. An error measurement circuit for use with a pipeline ADC, the error measurement circuit comprising:
   a first capacitor;
   a second capacitor;
   an output stage coupled to the first and second capacitors and a pipeline structure comprising a plurality of converting units of the pipeline ADC, the output stage including an output end; and
   a switch combination coupled to the first and second capacitors for switching to change capacitance allocation of the first and second capacitors located among a plurality of fixed biasing voltages and the output stage according to a plurality of control signals to generate a plurality of measurement values at the output end;

wherein the switching combination switches the connecting of the first capacitor and the second capacitor such that at a first capacitance allocation the first capacitor is electrically connected to a first node and the second capacitor is electrically connected to a second node, and at a second capacitance allocation the first capacitor is electrically connected to the second node and the second capacitor is electrically connected to the first node.

8. The error measurement circuit of claim 7, wherein the output stage comprises an operational amplifier.

9. The error measurement circuit of claim 7, wherein the switch combination comprises:
   a set of first switches for selectively connecting an end of the first capacitor to one of the fixed biasing voltage; and
   a second switch for selectively connecting said end of the first capacitor to the output stage.

10. The error measurement circuit of claim 9, wherein the set of first switches and the second switch are activated alternatively.

* * * * *